United States Patent
Thiagarajan et al.

(10) Patent No.: US 7,944,955 B2
(45) Date of Patent: May 17, 2011

(54) LIQUID COOLED LASER BAR ARRAYS INCORPORATING DIAMOND/COPPER EXPANSION MATCHED MATERIALS

(75) Inventors: Prabhu Thiagarajan, Tucson, AZ (US);
Mark McElhinney, Tucson, AZ (US);
John J. Cahill, West Orange, NJ (US)

(73) Assignee: Lasertel, Inc., Tucson, AZ (US)

( * ) Notice: Subject to any disclaimer, the term of this patent is extended or adjusted under 35 U.S.C. 154(b) by 0 days.

(21) Appl. No.: 12/648,141

(22) Filed: Dec. 28, 2009

(65) Prior Publication Data

US 2010/0098121 A1     Apr. 22, 2010

Related U.S. Application Data

(63) Continuation of application No. 12/105,126, filed on Apr. 17, 2008, now Pat. No. 7,660,335.

(51) Int. Cl.
*H01S 3/04* (2006.01)
(52) U.S. Cl. ............................. 372/34; 372/36
(58) Field of Classification Search .................. 372/36, 372/34, 50.12
See application file for complete search history.

(56) References Cited

U.S. PATENT DOCUMENTS

| | | | |
|---|---|---|---|
| 3,711,939 A | 1/1973 | Stoll | 29/424 |
| 3,805,375 A | 4/1974 | LaCombe et al. | 29/577 |
| 5,105,429 A * | 4/1992 | Mundinger et al. | 372/34 |
| 5,311,530 A | 5/1994 | Wagner et al. | 372/36 |
| 5,311,535 A | 5/1994 | Karpinski | 372/50 |
| 5,394,426 A * | 2/1995 | Joslin | 372/50.12 |
| 5,455,738 A | 10/1995 | Montesano et al. | 361/707 |
| 5,504,767 A | 4/1996 | Jamison et al. | 372/41 |
| 5,521,931 A * | 5/1996 | Biegelsen et al. | 372/36 |
| 5,764,675 A | 6/1998 | Juhala | 372/50 |
| 5,783,316 A | 7/1998 | Colella et al. | 428/660 |
| 5,812,573 A | 9/1998 | Shiomi et al. | 372/44 |
| 6,424,667 B1 * | 7/2002 | Endriz et al. | 372/36 |
| 6,480,514 B1 | 11/2002 | Lorenzen et al. | 372/35 |
| 6,535,533 B2 | 3/2003 | Lorenzen et al. | 372/34 |
| 6,727,117 B1 | 4/2004 | McCoy | 438/106 |
| 6,865,200 B2 | 3/2005 | Takigawa et al. | 372/35 |
| 7,016,383 B2 | 3/2006 | Rice | 372/36 |
| 7,359,413 B2 * | 4/2008 | Tzuk et al. | 372/34 |

* cited by examiner

*Primary Examiner* — Minsun Harvey
*Assistant Examiner* — Tuan N. Nguyen
(74) *Attorney, Agent, or Firm* — Hayes Soloway P.C.

(57) ABSTRACT

A laser diode array having a plurality of diode bars bonded by a hard solder to expansion matched spacers and mounted on a gas or liquid cooled heatsink. The spacers are formed of a material such as copper/diamond composite material having a thermal expansion that closely matches that of the laser bars.

27 Claims, 2 Drawing Sheets

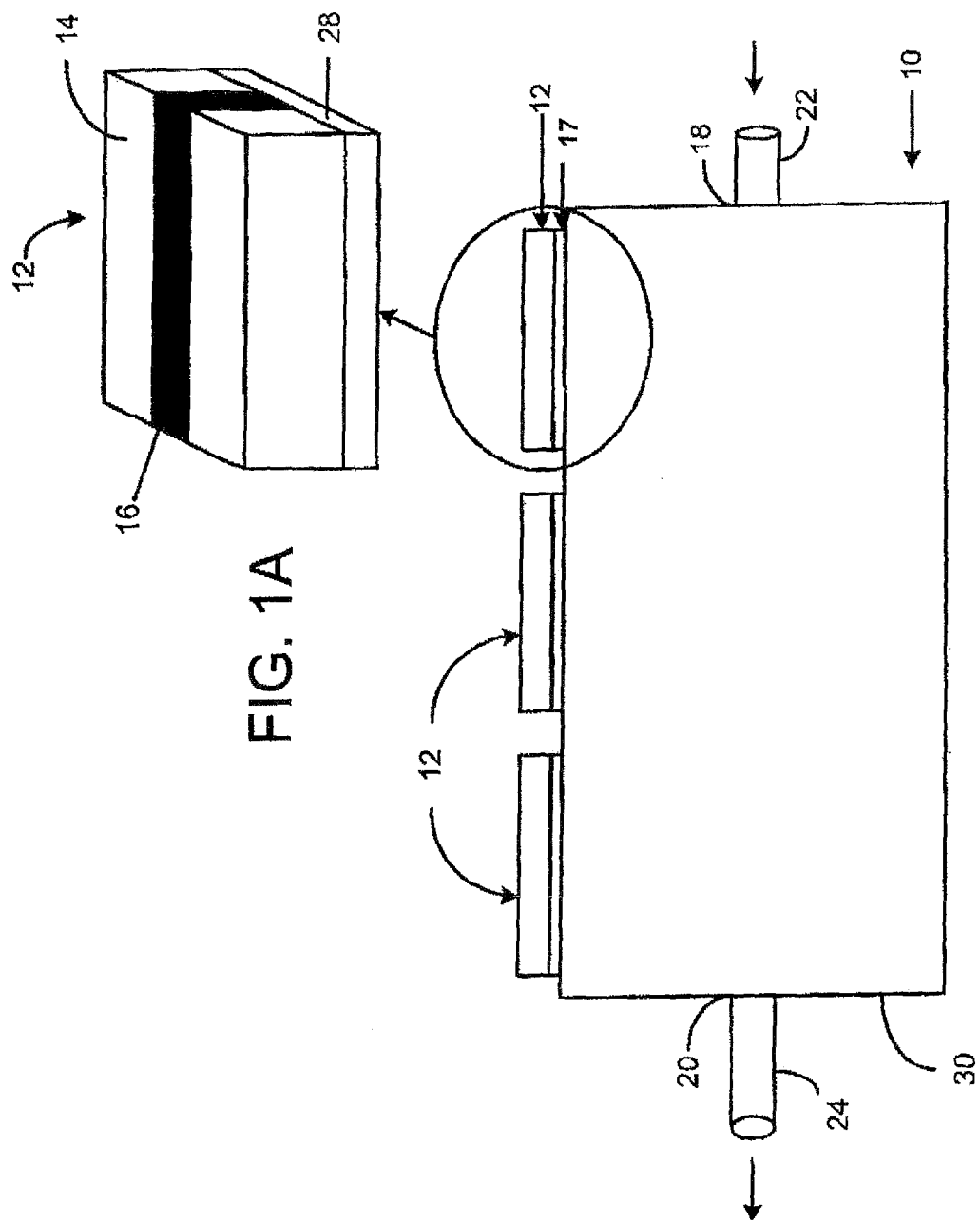

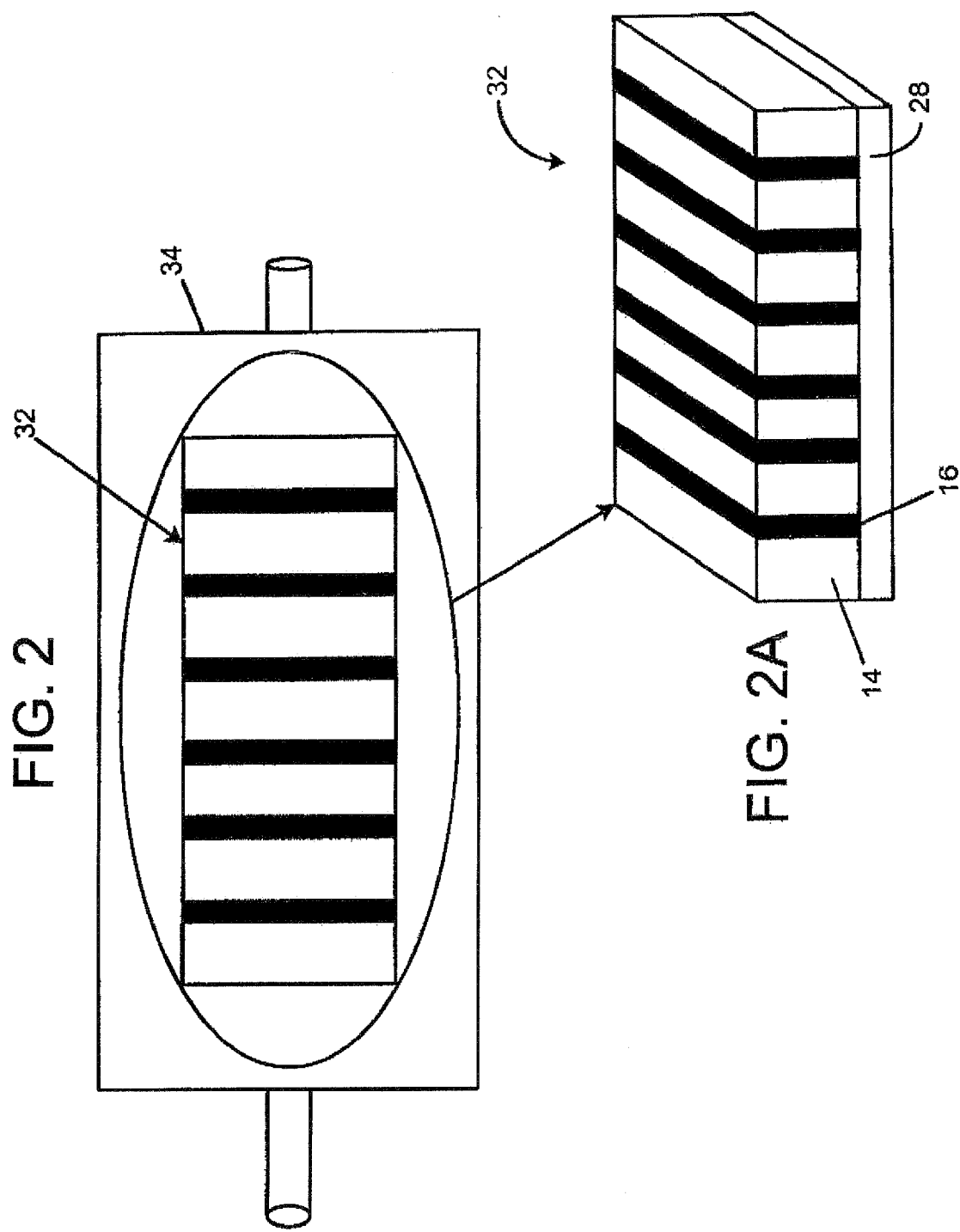

LIQUID COOLED LASER BAR ARRAYS INCORPORATING DIAMOND/COPPER EXPANSION MATCHED MATERIALS

CROSS REFERENCE TO RELATED APPLICATION

This application is a continuation of prior U.S. application Ser. No. 12/105,126, filed Apr. 17, 2008, now U.S. Pat. No. 7,660,335.

FIELD OF THE INVENTION

This invention relates generally to laser diodes, and more particularly is related to laser diode arrays and methods for manufacturing laser diode arrays.

BACKGROUND OF THE INVENTION

Laser diode arrays are in general used in a wide variety of industrial and research applications. Pluralities of diode bars are mounted on a substrate to provide the multiplied power of numerous bars, versus the effect offered by a single bar. For arrays that are operated in harsh environments such as high temperatures or rapidly changing temperatures it is desired that the entire array assembly be assembled with high temperature, so-called hard solders. In arrays that are fabricated with high temperature solders it is imperative to minimize the stress induced in the laser bar from the assembly process. To optimize the efficiency of a multiple diode bar array the materials used must also have high electrical conductivity and thermal conductivity. Historically, this has required the use of materials that have different thermal expansion properties. In a hard soldered assembly small thermal expansion mismatches can cause stress on the bars and hence reliability issues. In addition good alignment of the bars is necessary to maintain high efficiency, good performance, and high reliability.

Laser diode arrays characteristically have large heat dissipation per unit area of the laser diodes. This increase in temperature results in a limitation on output intensity. As the temperature increases and decreases, the device is subject to thermal cycling, shortening the life of the array. Furthermore, at higher temperatures the laser emission will be shifted in wavelength due to temperature induced shifts of the semiconductor bandgap.

Several patents have been directed to improve the heat removal capability of laser diode arrays. Specifically, array designs have incorporated microchannel cooling as a means for heat removal. Microchannel coolers are small devices with channels etched therein to supply a coolant in close proximity to the heat source. See for example, U.S. Pat. Nos. 5,105,429; 5,311,530; 6,480,514; 6,865,200 and 7,016,383.

These prior art patents require complex assemblies involving many individual components joined together mechanically and using o-rings to seal the fluid paths. This makes assemblies of micro-channel coolers somewhat fragile, prone to fluid leaks and misalignment. In addition, the small fluid channels used in micro-channel coolers are prone to blockage and thus require filtered water as the cooling fluid which adds to operating costs. The high water velocity in the channels also leads to erosion of the channels, leading to failure of the assembly. Moreover, since the water is in the electrical path it must be electrically insulating or de-ionized. De-ionized water is somewhat corrosive, and thus requires corrosive resistant materials and coatings to prevent the device from rapidly degrading.

Several prior art designs also have incorporated macro-channel cooling as a means for heat removal. However, macrochannel cooler assemblies have suffered from an inability to meet the cooling performance of micro-channel assemblies and have therefore been limited to certain low power applications or applications where the laser diode bars can be placed far enough apart to enable the heat generated in each bar to be removed. In addition macrochannel cooler assemblies have typically employed soft low temperature, so-called soft solders to permit movement between thermally expansion mismatched materials. While soft solders permit movement and thus reduce stress, they are subject to fatigue type failures and can creep over time leading to catastrophic failure.

SUMMARY OF THE INVENTION

The present invention overcomes the aforesaid and other disadvantages of the prior art by providing a liquid cooled laser bar array in which the laser diode bars are soldered to electrically conductive spacers formed of a highly thermally conductive copper/diamond material that has a thermal expansion coefficient that closely matches that of the laser bars. Using a spacer material having a thermal expansion that closely matches that of the laser bars minimizes stress induced by thermal expansion, and also permits the use of hard solders. The monolithic nature of the laser bar/spacer assembly also means that heat is removed from both sides of the laser bar rather than just one side as is the case with micro-channel cooler assemblies. The monolithic laser diode bar/spacer assembly is then mounted on an electrically isolating expansion matched ceramic using hard solder. This in turn is mounted on a macro-channel cooler. The high thermal conductivity of the spacers enables such assemblies to operate at powers previously only possible with the use of micro-channel coolers, and the monolithic type of construction makes the assemblies extremely mechanically robust. The water path is isolated from the electrical path and hence does not require the use of de-ionized water. The monolithic construction means that no o-ring seals are necessary. The invention is particularly useful in nigh-powered continuous wave (CW) laser diode arrays as well as high-powered pulsed lasers.

BRIEF DESCRIPTION OF THE DRAWINGS

Further features and advantages of the invention will be seen from the following detailed description, taken in conjunction with the accompanying drawings, wherein like numerals depict like parts, and wherein:

FIG. 1 is a side elevational view of a laser diode array assembly, and FIG. 1A is a prospective view of an individual laser bar array in accordance with one embodiment or the present invention; and FIG. 2 is a top plan view of a laser diode array assembly, and FIG. 2A is a prospective view of a laser bar array in accordance with a second embodiment of the present invention.

DETAILED DESCRIPTION

The present invention provides laser diode array assembly with improved heat removal capability and reliability. More particularly, in accordance with the present invention, the laser bar array 12 includes spacer material 14 formed of a copper/diamond composite material that has a thermal expansion that closely matches that of the laser bars 16. This permits the use of a hard solder and provides increased reliability. This array is then mounted on a heatsink or substrate with an intervening ceramic layer 28 to provide electrical isolation.

FIG. 1 and FIG. 1A illustrate a laser bar assembly 10 and laser bar array 12 in accordance with the first embodiment of the invention. The laser bar assembly comprises a plurality of laser diode bar arrays 12 having laser diode bars 16 aligned end to end on a heat sink or substrate 30. The laser diode bar arrays 12 are held in place on the substrate 30 by a hard solder layer 17.

Two holes 18, 20 for supplying a coolant are formed in substrate 30. One hole 18 is used as an inlet for coolant fluid while the other hole 20 is used as an outlet. Inlet 18 and outlet 20 are connected via conduits 22 and 24, respectively, to a coolant fluid (gas or liquid) circulatory system (not shown).

Laser bars 16 are formed of conventional laser diode materials.

A feature and advantage of the present invention results from forming the spacer 14 from a material that closely matches the thermal expansion of the laser bars 16. This reduces stress in the assembly and also permits the use of hard solder. We have found that diamond/copper composite materials have a thermal expansion that closely matches that of the laser bars. Typically the diamond/copper composite may comprise 30-50% by volume of diamond, preferably 35-45% by volume, more preferably 38-42% by volume. Preferably the diamond particles are relatively uniform in size and typically have a maximum size of about 500 microns, preferably less than 200 microns, more preferably less than 100 microns. If desired, the diamond particles may be coated, e.g. with a layer of Cr, W, Mo, Co, Ti, Si, SiC, TiN, TiC, Ta or Zr. The diamond/copper ratio in the diamond/copper composite is chosen to provide a material that has a thermal expansion that closely matches that of the laser bar material. As a result, the laser diode bars may be soldered directly to the spacers using a hard, high temperature solder such as a gold/tin solder or gold/germanium solder which are given as exemplary.

Referring to FIG. 2 and FIG. 2A, there is shown an alternative embodiment of the invention. In the FIG. 2/2A embodiment, the laser bars 16 are aligned parallel to one another in an array 32 on the substrate 34.

While the present invention has been described in connection with a macrochannel cooled laser array, it is not necessary that the substrate comprise a marcro-channel cooler. Rather, the heat sink may comprise a microchannel cooler, or an air cooled heat sink. Thus, the embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise fonn disclosed. Many modifications and variations are possible in light of the teachings above without departing from the spirit and scope of the present invention.

We claim:

1. A laser diode array having a plurality of laser diode bars sandwiched between spacer material, and mounted by soldered to a substrate,
wherein the spacer material is formed of a material having a thermal expansion that closely matches that of the laser diode bars, and wherein the spacer material is a copper/diamond composite material comprising 30-50 volume percent diamond and the balance comprising primary copper; wherein the diamond particles are relatively uniform in size; wherein the diamond particles are coated with a material selected from the group consisting of Cr, W, Mo, Co, Ti, Si, SiC, TiN, TiC, Ta and Zr; wherein the substrate includes an inlet hole and an outlet hole for passing a coolant fluid through the substrate.

2. The laser bar array of claim 1, wherein the diamond/copper composite material comprises 35-45 volume percent diamond and the balance comprising primarily copper.

3. The laser bar array of claim 2, wherein the diamond/copper composite material comprises 38-42 volume percent diamond and the balance comprising primarily copper.

4. The laser bar array of claim 1, wherein the diamond particles have a maximum size of 500 microns.

5. The laser bar array of claim 4, wherein the diamond particles have a maximum size of 200 microns.

6. The laser bar array of claim 5, wherein the diamond particles have a maximum size of about 100 microns.

7. The laser bar array of claim 1, wherein the solder comprises a hard, high temperature solder.

8. The laser bar array of claim 7, wherein the solder comprises a gold/tin hard, high temperature solder.

9. The laser bar array of claim 7, wherein the solder comprises a hard, high temperature gold/germanium solder.

10. The laser bar array of claim 1, wherein the laser bars are aligned end to end on the substrate.

11. The laser bar array of claim 1, wherein the laser bars are aligned parallel to one another on the substrate.

12. The laser bar array of claim 1, wherein the substrate includes an inlet hole and an outlet hole for passing a coolant through the substrate.

13. The laser bar array of claim 12, wherein the coolant comprises a gas.

14. The laser bar array of claim 12, wherein the coolant comprises a liquid.

15. A laser diode array having a plurality of laser diode bars sandwiched between spacer material, and mounted by a hard, high temperature solder to wherein the spacer material is formed of a copper/diamond composite material having a thermal expansion that closely matches that of the laser bars; wherein the diamond particles are relatively uniform in size; wherein the solder comprises a hard, high temperature gold/germanium solder or a gold/tin hard, high temperature solder; wherein the substrate includes an inlet hole and an outlet hole for passing a coolant through the substrate.

16. The laser bar array of claim 15, wherein the diamond/copper composite material comprises 30-50volume percent diamond and the balance comprising primarily copper.

17. The laser bar array of claim 16, wherein the diamond/copper composite material comprises 35-45 volume percent diamond and the balance comprising primarily copper.

18. The laser bar array of claim 17, wherein the diamond/copper composite material comprises 38-42 volume percent diamond and the balance comprising primarily copper.

19. The laser bar array of claim 15, wherein the diamond particles have a maximum size of 500 microns.

20. The laser bar array of claim 19, wherein the diamond particles have a maximum size of 200 microns.

21. The laser bar array of claim 20, wherein the diamond particles have a maximum size of about 100 microns.

22. The laser bar array of claim 15, wherein the diamond particles are coated with a material selected from the group consisting of Cr, W, Mo, Co, Ti, Si, SiC, TiN, TiC, Ta and Zr.

23. The laser bar array of claim 15, wherein the laser bars are aligned end to end on the substrate.

24. The laser bar array of claim 15, wherein the laser bars are aligned parallel to one another on the substrate.

25. The laser bar array of claim 15, wherein the substrate includes an inlet hole and an outlet hole for passing a coolant through the substrate.

26. The laser bar array of claim 25, wherein the coolant comprises a gas.

27. The laser bar array of claim 25, wherein the coolant comprises a liquid.

* * * * *